United States Patent [19]

Inomata

[11] Patent Number: 5,008,307
[45] Date of Patent: Apr. 16, 1991

[54] LIQUID SILICONE RUBBER COMPOSITION CAPABLE OF YIELDING A THERMAL CONDUCTIVE VULCANIZED PRODUCT

[75] Inventor: Hiroshi Inomata, Takasaki, Japan

[73] Assignee: Shin-Etsu Chemical Co., Ltd., Japan

[21] Appl. No.: 449,330

[22] Filed: Dec. 11, 1989

Related U.S. Application Data

[63] Continuation of Ser. No. 178,167, Apr. 6, 1988, abandoned.

[30] Foreign Application Priority Data

Apr. 6, 1987 [JP]  Japan ................................. 62-83990

[51] Int. Cl.$^5$ ................................................ C08K 7/08
[52] U.S. Cl. ................................... 523/220; 523/223; 524/786; 524/862
[58] Field of Search ............... 524/786, 862; 523/220, 523/223

[56] References Cited

U.S. PATENT DOCUMENTS

| 3,078,249 | 2/1963 | Russell | 523/216 |
|---|---|---|---|
| 3,445,420 | 5/1969 | Koeksodnedes et al. | |
| 3,532,649 | 10/1970 | Smith et al. | |
| 4,196,012 | 4/1980 | Windle | 523/220 |
| 4,216,140 | 8/1980 | Simizu | 524/786 |
| 4,444,944 | 4/1984 | Matsushita | 524/786 |
| 4,604,424 | 8/1986 | Cole et al. | 524/862 |
| 4,656,819 | 3/1987 | Nakamoto | 523/223 |

FOREIGN PATENT DOCUMENTS

| 45-9476 | 4/1970 | Japan . | |
| 48-10947 | 4/1973 | Japan . | |
| 55-22891 | 2/1980 | Japan . | |
| 56-2349 | 1/1981 | Japan . | |
| 57-191902 | 11/1982 | Japan | 524/786 |
| 38-26771 | 12/1983 | Japan . | |
| 58-219259 | 12/1983 | Japan . | |

Primary Examiner—John C. Bleutge
Assistant Examiner—R. Dean, Jr.
Attorney, Agent, or Firm—Lowe, Price, LeBlanc, Becker & Shur

[57] ABSTRACT

A liquid silicone rubber composition capable of yielding a thermally conductive elastomer which comprises an organopolysiloxane capable of reaction with an organohydrogenpolysiloxane having at least two $\equiv$SiH bonds, two types of alumina powders having, respectively, defined average sizes, and a catalytic amount of platinum or a platinum compound used as a catalyst for the reaction between the organopolysiloxane and the organohydrogenpolysiloxane.

13 Claims, No Drawings

LIQUID SILICONE RUBBER COMPOSITION CAPABLE OF YIELDING A THERMAL CONDUCTIVE VULCANIZED PRODUCT

This application is a continuation of application Ser. No. 07/178,167, filed Apr. 6, 1988, now abandoned.

BACKGROUND OF THE INVENTION

1. Field of the Invention

This invention relates to silicon rubber compositions and more particularly, to liquid silicone rubber compositions which are especially useful as an insulating adhesive or potting material for various printed circuits. The composition has a low viscosity with good workability and exhibits high thermal conductivity when vulcanized.

2. Description of the Prior Art

Electrically insulating adhesives or potting materials for printed circuits and hybrid integrated circuits having transistors, integrated circuits and memory elements are generally required to dissipate heat generated during operations by thermal transmission. To this end, thermal conductive compositions have been used as such adhesives or insulating potting materials. Japanese Laid-open Patent Application No. 55-22891 describes one of such compositions, which contains polyorganosiloxane, aluminum oxide, beryllium oxide or magnesium oxide, and an organic peroxide. However, this composition is not fluid but is solid in nature. Thus, the composition cannot be employed as a potting agent.

Japanese Laid-open Patent Application No. 50-2349 describes a composition which comprises an addition-reactive mixture of a vinyl group-containing organopolysiloxane, organohydrogenpolysiloxane and a platinum compound, to which alumina is added. This composition is disadvantageous in that it is dark in color and has poor thermal conductivity because the composition is unlikely to be dispersed uniformly.

To overcome the above disadvantage, Japanese Laid-open Patent Application No. 58-219259 proposed an improved composition in which the alumina used is defined to have an average particle size of 2.0 to 10 micrometers and an oil absorption of not less than 15 ml/g. This composition has the drawback that it has high viscosity prior to vulcanization and the product obtained by vulcanization of the composition is unsatisfactory with respect to the thermal conductivity. Thus, satisfactory thermal conductive silicone compositions useful for the above purposes have not been obtained yet.

SUMMARY OF THE INVENTION

It is an object of the present invention to provide a liquid silicone rubber composition which solves the problems involved in the prior art compositions.

It is another object of the invention to provide a liquid silicone composition which has a viscosity sufficient for its application to various electric and electronic parts as an adhesive or potting agent without any difficulty and which exhibits high thermal conductivity when vulcanized.

It is a further object of the invention to provide a liquid silicone composition which has good mechanical strength when vulcanized.

The present invention contemplates to provide a liquid silicone composition capable of yielding a vulcanized product having good thermal conductivity. The composition comprises:

100 parts by weight of an organopolysiloxane having the following average unit formula $$R_xSiO_{(4-x)/2}$$

in which each R represents an unsubstituted or substituted monovalent hydrocarbon group, and X is a value of 1.8 to 3.0, the organopolysiloxane containing at least 0.1 mole % of an aliphatic unsaturated group in one molecule and having a viscosity of from 50 to 10,000 centistrokes at 25° C.;

from 0.1 to 50 parts by weight of an organohydrogenpolysiloxane having at least two 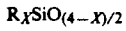 SiH bonds in one molecule;

from 270 to 900 parts by weight of an alumina filler made of from 10 to 95 wt % of a substantially spherical or round alumina powder having an average size of from 10 to 50 micrometers and, correspondingly, from 90 to 5 wt % of an alumina powder having an average size less than 10 micrometers; and a catalytic amount of platinum or a platinum compound catalyst for the addition reaction between the organopolysiloxane and the organohydogenpolysiloxane. The composition comprised of the above ingredients has generally a viscosity of not larger than 100,000 centistokes at 25° C.

The composition of the invention is characterized in that two types of alumina powders having different average sizes are added to an addition-reactive silicone mixture. When the silicone mixture is added to a product of the addition reaction between an aliphatic unsaturated group-containing organopolysiloxane and an organohydrogenpolysiloxane having at least two 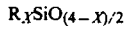 Si-H bonds in the presence of platinum or a platinum compound, the following advantages are produced. One of the advantages is that since the main ingredient of the aliphatic unsaturated group-containing organopolysiloxane has a viscosity of not larger than 10,000 centistokes at 25° C., the viscosity of the composition is maintained at a level not larger than 100,000 centistokes, ensuring easy handling of the composition in practical applications. Another advantage is that when the composition is vulcanized, the resultant product exhibits a very high thermal conductivity of $3 \times 10^{-3}$ cal/cm.second.° C. or over. This is due to the use of the two types of alumina powders.

DETAILED DESCRIPTION AND EMBODIMENTS OF THE INVENTION

The first ingredient used in the composition of the invention is an organopolysiloxane having the following general average unit formula $$R_xSiO_{(4-x)/2}$$

in which R represents an unsubstituted or substituted monovalent hydrocarbon group and X is a value of from 1.8 to 3.0. The monovalent hydrocarbon groups have preferably from 1 to 8 carbon atoms. Examples of the monovalent hydrocarbon groups include an alkyl group such as a methyl group, an ethyl group, a propyl group, a butyl group and the like, a cycloalkyl group such as a cyclohexyl group, an alkenyl group such as a vinyl group, an allyl group, a butenyl group and the like, and an aryl group such as a phenyl group, a tolyl group and the like. Further, these groups may be partly or wholly substituted with a halogen atom such as chlorine, bromine, iodine or fluorine, a cyano group or the like. Specific examples of the substituted groups include a chloromethyl group, a chloropropyl group, a trifluoropropyl group, a 2-cyanoethyl group and the like. In the above formula, R's may be the same or different. For causing the organopolysiloxane to undergo the addition reaction with an organohydrogenpolysiloxane used as the second ingredient, the organopolysiloxane should have an aliphatic unsaturated group such as an alkenyl group in an amount of 0.1 mole % or over in the molecule. Typical examples of the aliphatic unsaturated groups include alkenyl groups such as a vinyl group, an allyl group and the like. Of these, the vinyl group is preferred. Specific examples of the organopolysiloxane are indicated below.

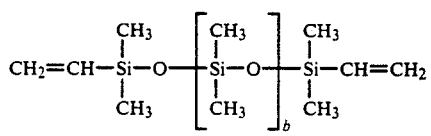 (i)

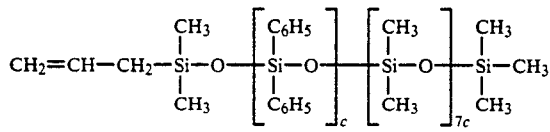 (ii)

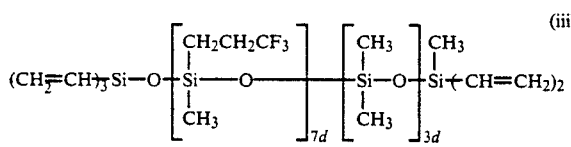 (iii)

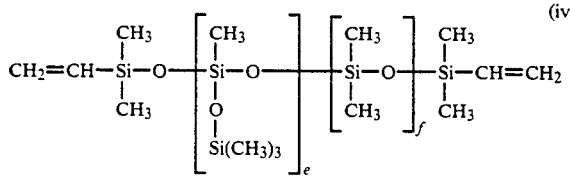 (iv)

In the above formulae (i) through (iv), b to f are independently a positive integer.

These organopolysiloxanes are obtained by a known procedure which comprises reacting a compound of the following formula forming end groups

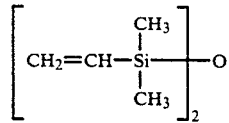

with a siloxane oligomer having units of the following formula

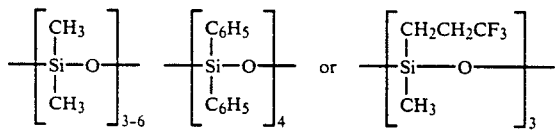

in the presence of a catalyst of an alkali such as potassium hydroxide or cesium hydroxide, or sulfuric acid at a temperature of −10° to 200° C., thereby causing a thermal equilibration reaction, and neutralizing the catalyst.

If the organopolysiloxane is too low in degree of polymerization, the resultant vulcanized product undesirably becomes hard and brittle. On the contrary, when the degree of polymerization is too high, a composition using such an organopolysiloxane becomes too high in viscosity, impeding easy handling of the composition prior to vulcanization. Accordingly, the organopolysiloxane should preferably have a viscosity of from 50 to 10,000 centistokes, preferably from 100 to 1,000 centistokes, at 25° C. The degree of polymerization can be appropriately controlled by controlling the concentration of the end group-forming compound.

The organohydrogenpolysiloxane used as the second ingredient of the composition of the invention should have at least two ≡SiH bonds or at least two hydrogen atoms bonded to silicon atoms in one molecule. Through the ≡SiH bonds, the organohydrogenpolysiloxane undergoes addition reaction with the aliphatic unsaturated group-containing organopolysiloxane of the first ingredient. The second ingredient should preferably be miscible with the first ingredient. Specific and, in fact, preferable examples of the second ingredient are indicated below as (v) to (vii).

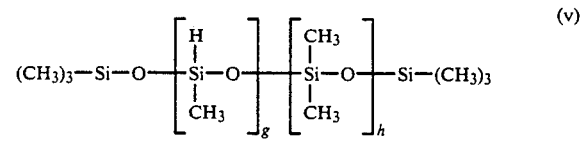 (v)

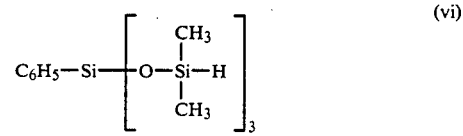 (vi)

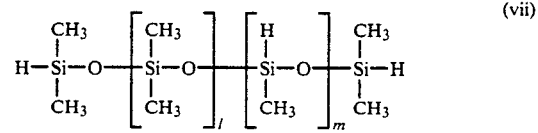 (vii)

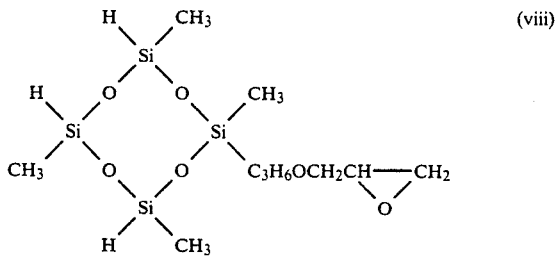 (viii)

In the above formulae (v) to (vii), g, h, l and m are independently a positive integer.

The organohydrogenpolysiloxanes are prepared by a procedure which comprises subjecting [(CH$_3$)$_3$Si]$_2$O or [H(CH$_3$)$_2$Si]$_2$O and an oligomer having the units of the following formula

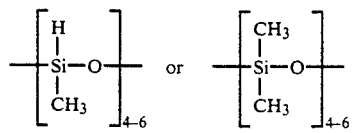

to equilibration reaction in the presence of a catalyst such as sulfuric acid at a temperature of from −10° to 100° C. The organohydrogenpolysiloxane may also be obtained by partial addition reaction between the above two ingredients. If the resultant product has too small a molecular weight, it is liable to volatize. On the contrary, when the molecular weight is too large, the siloxane product becomes excessively viscous. Accordingly, the organohydrogenpolysiloxane should preferably have from 4 to 500 silicon atoms, more preferably from 5 to about 100 silicon atoms, and a viscosity of from 1 to 300 centistokes at 25° C.

The amount of the organohydrogenpolysiloxane is generally in the range of from 0.1 to 50 parts by weight per 100 parts by weight of the organopolysiloxane used as the first ingredient. When the amount is less than 0.1 part by weight, the addition reaction does not proceed satisfactorily and the composition may undesirably flow after vulcanization. Over 50 parts by weight, foaming may take place. In other words, the organohydogenpolysiloxane is used in such a way that the ≡SiH bonds are in the range of 0.5 to 3 moles per mole of the aliphatic unsaturated group contained in the first ingredient. Within this range, a final vulcanized product can be arbitrarily controlled to have a complex Young's modulus of from $10^3$ to $10^7$ dynes/cm$^2$.

The third ingredient used in the composition of the invention is an alumina filler which is a mixture of (a) a substantially spherical or round alumina powder having an average size of from 10 to 50 micrometers and (b) an alumina powder having an average size less than 10 micrometers. The alumina (a) has an average size of from 10 to 50 micrometers with a shape factor of 1.0 to 1.8, preferably from 1.0 to 1.5. It will be noted that the term "substantially spherical or round powder" used herein is intended to mean a powder which has a shape factor of from 1.0 to 1.8. The shape factor means a ratio between a major length and a minor length of the powder as determined, for example, by the use of an electron microphotograph of the powder. Larger particle sizes are more liable to settle. Accordingly, the particle size is preferably from 10 to 20 micrometers. The use of the alumina (a) alone may result in a thermal conductivity lower than a thermal conductivity of a composition using the alumina (b) in combination, but the viscosity of the composition tends to become low.

The alumina (b) may be in a spherical, round, non-spherical or crystalline form and should have an average particle size less than 10 micrometers, preferably from 0.5 to 5 micrometers. Although this alumina (b) contributes to increase the thermal conductivity of the composition, it may undergo structurization when stored over a long term, thus causing a considerable increase of the viscosity of the composition. This is why the two types of alumina powders are used in combination. When the alumina powders (a) and (b) are used in combination, the resultant composition has conveniently high thermal conductivity while suppressing an excessive increase of the viscosity. Even if the alumina (b) settles during use, a hard precipitate is not formed by the action of the alumina (a). Thus, once part of the alumina settles, it can be readily re-dispersed by mixing. The mixing ratio of the ingredients (a) and (b) depends on the thermal conductivity of an intended silicone rubber composition and is selected from the range of from 10 to 95 wt % of the ingredient (a) and from 5 to 90 wt % of the ingredient (b). In order to effectively suppress an excessive increase in viscosity of the composition by addition of the alumina, the powders (a) and (b) should preferably have an oil absorption of not larger than 30 ml/100 g and a specific surface area of not larger than 10 m$^2$/g. The combination of the powders (a) and (b) is advantageous in that if the alumina powders settle during storage, a hard precipitate does not form, so that it can be very readily mixed and dispersed again.

When the liquid silicone rubber composition of the invention is used as a potting agent or an adhesive for various electronic parts, the alumina filler should preferably have an alkali or acid content of not larger than 5 ppm and should preferably have low electric conductivity with respect to an aqueous extract of the filler. The total amount of the alumina powders (a) and (b) is generally in the range of from 270 to 900 parts by weight per 100 parts by weight of the first ingredient of the organopolysiloxane. Less amounts may lead to a lowering of thermal conductivity. On the other hand, larger amounts are unfavorable because the viscosity of the resultant composition may excessively increase. Preferably, the alumina should be totally contained in an amount of not less than 40 vol. % of the composition.

The platinum or platinum compound used as the fourth ingredient of the composition serves as a catalyst for the addition reaction between the aliphatic unsaturated group-containing organopolysiloxane used as the first ingredient and the organohydrogenpolysiloxane used as the second ingredient. These catalysts may be those which are ordinarily used for hydrosilation. Examples of the platinum or platinum compounds include platinum black, solid platinum supported on a carrier such as silica or alumina, chloroplatinic acid, alcohol-modified chloroplatinic acid, complex salts of chloroplatinic acid and olefins or vinyl siloxanes, and the like. The amount of this ingredient is generally in the range of from 20 to 500 ppm based on the total amount of the first and second ingredients when a solid catalyst such as platinum black is used or in the range of from 1 to 30 ppm, as platinum, when a platinum compound, such as chloroplatinic acid, which is miscible with the organopolysiloxane is used.

The composition of the invention can be obtained by uniformly mixing predetermined amounts of the first to fourth ingredients by any suitable means. The composition is converted into a rubber elastomer when kept at room temperature. The conversion is facilitated by heating the composition to a temperature of 60° to 150° C. without a sacrifice of the characteristic properties.

Depending upon the amount of the second ingredients in relation to the first ingredient, the resultant product varies from a soft gel to a hard plastic. Accordingly, the mixing ratio between the first ingredient and the second ingredient should properly be controlled within the defined ranges of the respective ingredients to obtain a product of desired properties. For providing a composition having a low viscosity to ensure easy handling in applications and a vulcanized product having high thermal conductivity, the first ingredient and the third alumina ingredient are preliminarily mixed prior to mixing of all the ingredients, and agitated under reduced pressure to permit the alumina filler to be sufficiently wetted with the organopolysiloxane. Subsequently, the other ingredients are added to the mixture.

The composition of the invention may further comprise other various additives, if desired and, in fact, the use of such additives is preferable in some applications. For instance, in order to improve the strength of a final vulcanized elastomer, an organopolysiloxane having a resin structure and consisting of $SiO_2$ units, $CH_2=CH(R'_2)SiO_{0.5}$ units and $R'_3SiO_{0.5}$ units wherein each R' is a monovalent hydrocarbon group substantially free of any aliphatic unsaturated double bond as disclosed in Japanese Patent Publication Nos. 38-26771 and 45-9476 may be used. Moreover, for the purpose of controlling a vulcanizing speed of the composition, there may be used a polysiloxane comprising $CH_2=CHR'SiO$ units wherein R' has the same meaning as defined above (Japanese Patent Publication No. 48-10947), an acetylene compound U.S. Pat. No. 3,445,420), and ionic compounds of heavy metals U.S. Pat. No. 3,532,649). Additionally, a suitable amount of a functionality-free organopolysiloxane may be added in order to improve thermal shock resistance and flexibility.

For the purpose of reducing thermal shrinkage during vulcanization, lowering a coefficient of thermal expansion of a vulcanized elastomer, improving thermal stability, weatherability, chemical resistances, flame retardancy or mechanical strength, or lowering gas permeability, various fillers may be added. Examples of the fillers include fumed silica, quartz powder, glass fibers, carbon, metal oxides such as cerium oxide, iron oxide, titanium oxide and the like, and metal carbonates such as calcium carbonate, magnesium carbonate and the like. Moreover, suitable pigments, dyes or antioxidants may also be added.

In practical applications, the composition of the invention may be dissolved in an appropriate organic solvent such as, for example, toluene, xylene or the like, to a desired level of concentration, if necessary.

The liquid silicone rubber composition of the invention is converted into a rubber elastomer by vulcanization when kept at room temperature or by heating to a suitable temperature. The rubber elastomer has a high thermal conductivity of not less than $3.0 \times 10^{-3}$ cal/cm.sec.°C. Accordingly, the composition is considered useful as an adhesive or an insulating bonding agent for printed circuits having transistors, integrated circuits and memories, and hybride integrated circuits which required removal of heat generated in operation.

The present invention is described in more detail by way of examples, in which parts are by weight. In the examples, the viscosity is a value measured at 25° C., and the thermal conductivity is a value measured by the use of a C-matic thermal conductance tester available from Dynatec Co., Ltd.

EXAMPLES 1-3 and COMPARATIVE EXAMPLES 1-3

75 parts of a dimethylpolysiloxane blocked with a dimethylvinylsilyl group at both ends of the molecular chain and having a viscosity of 400 centistokes were mixed with 330 parts of spherical alumina having an average size of 15.5 micrometers and a shape factor of 1.2, followed by mixing while agitating under a reduced pressure of 200 mmHg for 260 minutes. A mixture of 25 parts of the above vinyl group-containing dimethylpolysiloxane and 0.1 part of a 2-ethylhexanol-modified chloroplatinic acid solution having a platinum concentration of 2 wt % was uniformly mixed with the alumina and dimethylpolysiloxane mixture to obtain compound A. The compound A was subjected to measurement of viscosity by the use of the Brookfield rotational viscometer equipped with rotor No. 4 at 30 r.p.m.

The above procedure was repeated using 330 parts of each of two types of alpha-alumina powders, each of which had a shape factor of 2.0 and which had, respectively, average sizes of 2.5 micrometers and 20 micrometers, thereby obtaining compounds B and C. These compounds were also subjected to measurement of viscosity in the same manner as mentioned above.

To 430.1 parts of each of the compounds A, B and C were added 7.8 parts of a methylhydrogenpolysiloxane of the following formula having a viscosity of 11 centistokes

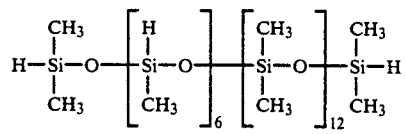

and 0.8 parts of 1,3,5,7-tetramethyl-1,3,5,7-tetravinylcyclotetrasiloxane, followed by uniform mixing to obtain compositions I to III. Moreover, mixtures of 95 parts, 75 parts and 30 parts of the compound A and, correspondingly, 5 parts, 25 parts and 70 parts of the compound B were prepared, to which the methylhydrogenpolysiloxane and 1,3,5,7-tetramethyl-1,3,5,7-tetravinylcyclotetrasiloxane as used above were added in the same amounts as indicated above, thereby obtaining compositions IV to VI.

These compositions were each molded to make disk moldings having a diameter of 50 mm and a thickness of 10 mm and 2 mm thick sheets. The individual disks and sheets were vulcanized or cured by heating under conditions of 100° C. and 1 hour to obtain test samples. These samples were subjected to measurement of physical properties. The results are summarized in Tables 1 and 2 below.

TABLE 1

| | Comparative Example | | |
|---|---|---|---|
| | 1 | 2 | 3 |
| | | Composition No. | |
| | I | II | III |
| Compound No. | A | B | C |
| Viscosity (centipoises) | 7,000 | 18,700 | 12,000 |
| Physical Properties of Vulcanized Product: | | | |
| Hardness (JIS A) | 68 | 74 | 70 |
| Elongation (%) | 64 | 75 | 60 |
| Tensile St. (kg/cm²) | 16 | 26 | 15 |
| Thermal Conductivity (cal/cm. sec. °C.) | $2.9 \times 10^{-3}$ | $3.4 \times 10^{-3}$ | $2.9 \times 10^{-3}$ |
| Secific Gravity | 2.24 | 2.24 | 2.24 |
| State of the compound after storage at room temperature for 1 month | Greatly separated in phase with a coagulated precipitate being produced. | Although small in phase separation and precipitation, structuring took place with no fluidity. | Greatly separated with a precipitate which is harder than A being produced. |

TABLE 2

| | Example | | |
|---|---|---|---|
| | 1 | 2 | 3 |
| | | Composition No. | |
| | IV | V | VI |
| Compound No. | A 95 | A 75 | A 30 |
| | B 5 | B 25 | B 70 |
| Viscosity (centipoises) | 8,000 | 8,200 | 13,000 |

TABLE 2-continued

| | Example | | |
|---|---|---|---|
| | 1 | 2 | 3 |
| | Composition No. | | |
| | IV | V | VI |
| Physical properties of Vulcanized Product: | | | |
| Hardness (JIS A) | 68 | 70 | 73 |
| Elongation (%) | 70 | 90 | 86 |
| Tensile St. (g/cm²) | 16 | 17 | 23 |
| Thermal Conductivity (cal/cm. sec. °C.) | $3.0 \times 10^{-3}$ | $3.2 \times 10^{-3}$ | $3.4 \times 10^{-3}$ |
| Specific Gravity | 2.24 | 2.24 | 2.24 |
| State of the compound after storage at room temperature for 1 month | Separated and precipitated, but the precipitation was so soft as to permit easy remixing | Separated and precipitated in lesser degrees than in Example 1 | Although small in degree of separation and precipitation, the viscosity increases slightly |

From the results of the Tables 1 and 2, it will be seen that the composition of the Comparative Example 2 has a high thermal conductivity but is too high in viscosity, and the composition of the Comparative Example 1 has a low thermal conductivity and produces a hard precipitate by settling. Further, the composition of the Comparative Example 3 exhibits poor fluidity owing to the occurrence of the structuring. In contrast, the compositions of the examples have a thermal conductivity of not less than $3 \times 10^{-3}$ cal/cm.sec.°C. with good fluidity and are thus advantageous over those compositions of the comparative examples.

EXAMPLE 4

To 130 parts of a dimethylpolysiloxane (ingredient 1) blocked with a dimethylvinyl group at ends of the molecular chain and having a viscosity of 600 centistokes were added 600 parts of spherical alumina having an average size of 15.5 micrometers and 200 parts of crystalline alumina having an average size of 2.5 micrometers, followed by mixing in a mixer at room temperature for 60 minutes and further mixing under a reduced pressure of 10 mmHg for 60 minutes. Thereafter, 70 parts of the ingredient 1 was added to the mixture to obtain compound D. To the thus obtained compound D were further added 8 parts of the methylhydrogenpolysiloxane used in Examples 1 to 3, 0.2 parts of a 2-ethylhexanol solution of a complex salt catalyst of 1,3-divinyl-1,1,3,3-tetramethyldisiloxane and platinum having having a platinum concentration of 1 wt %, and 0.02 parts of 2-ethynylisopropanol, followed by uniform mixing to obtain composition VII. This composition was heated and vulcanized under conditions of 80° C. and 4 hours, thereby obtaining a cured product. The product was subjected to measurement of physical properties with the results shown in Table 3 below.

TABLE 3

| | |
|---|---|
| Viscosity of Compound D, centistokes | 19,000 |
| Properties of The Cured Product: | |
| Hardness (JIS A) | 70 |
| Elongation (%) | 70 |
| Tensile Strength (kg/cm²) | 20 |
| Thermal Conductivity (cal/cm. sec. °C.) | $4.4 \times 10^{-3}$ |
| Volume Resistivity (ohms-cm) | $7.1 \times 10^{14}$ |
| Dielectric Constant 1 KHz) | 50 |
| Coefficient of Thermal Expansion (cm/cm. °C.) | $2.0 \times 10^{-4}$ |
| Specific Gravity | 2.37 |

What is claimed is:

1. A liquid silicone rubber composition capable of yielding a vulcanized product having good thermal conductivity, said composition comprising:

100 parts by weight of an organopolysiloxane having the following average unit formula $$R_xSiO_{(4-x)/2}$$

in which each R represents an unsubstituted or substituted monovalent hydrocarbon group, and X is a value of 1.8 to 3.0, the organopolysiloxane containing at least 0.1 mole % of an aliphatic unsaturated group in one molecule and having a viscosity of from 50 to 10,000 centistokes at 25° C.;

from 0.1 to 50 parts by weight of an organohydrogenpolysiloxane having at least two ≡SiH bonds in one molecule;

from 270 to 900 parts by weight of an alumina filler made of (a) from 10 to 95 wt % of an alumina powder having a substantially spherical shape and an average size of from 10 to 50 micrometers and, correspondingly, (b) from 90 to 5 wt % of an alumina powder having an average size less than 10 micrometers; and a catalytic amount of platinum or a platinum-containing compound catalyst for the addition reaction between the organopolysiloxane and the organohydrogenpolysiloxane.

2. A liquid silicone rubber composition according to claim 1, wherein said organopolysiloxane is a member selected from the group consisting of compounds of the following formulae (i) to (iv)

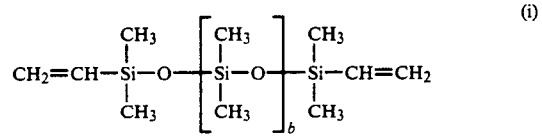

(i)

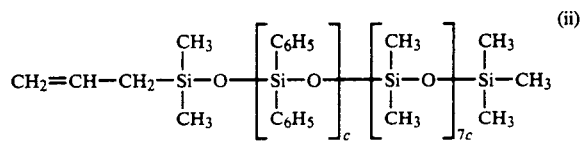

(ii)

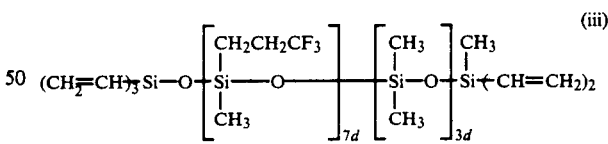

(iii)

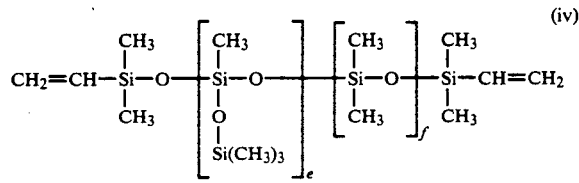

(iv)

in which b to f are independently a positive integer.

3. A liquid silicone rubber composition according to claim 1, wherein said aliphatic unsaturated group is a vinyl group.

4. A liquid silicone rubber composition according to claim 1, wherein said organopolysiloxane has a viscosity of from 100 to 1,000 centistokes at 25° C.

5. A liquid silicone rubber composition according to claim 1, wherein said organohydrogenpolysiloxane is a member selected from the group consisting of compounds of the following formulae (v) to (viii)

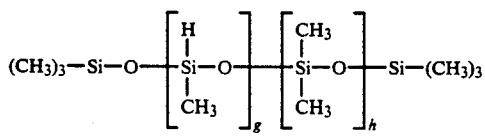 (v)

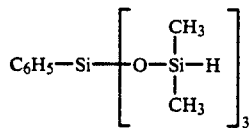 (vi)

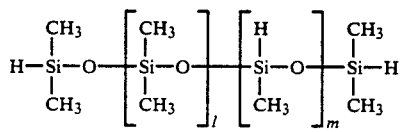 (vii)

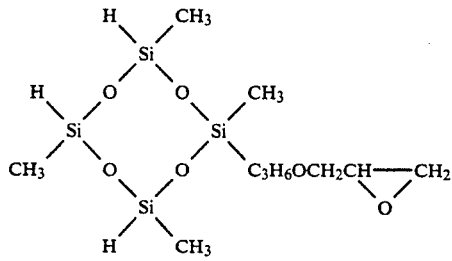 (viii)

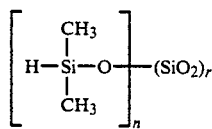 (ix)

in which g, h, i and m are independently a positive integer.

6. A liquid silicone rubber composition according to claim 1, wherein said organohydrogenpolysiloxane has from 4 to 500 silicon atoms and a viscosity of from 1 to 300 centistokes at 25° C.

7. A liquid silicone rubber composition according to claim 1, wherein the alumina powder in (a) has a shape factor of from 1.0 to 1.8.

8. A liquid silicone rubber composition according to claim 1, wherein the alumina powder in (a) has a shape factor of from 1.0 to 1.5 and an average size of from 10 to 20 micrometers.

9. A liquid silicone rubber composition according to claim 1, wherein the alumina powder in (b) has an average size of from 0.5 to 5 micrometers.

10. A liquid silicone rubber composition according to claim 1, wherein both alumina powders in (a) and (b) have, respectively, an oil absorption of not larger than 30 ml/100 g and a specific surface area of not larger than 10 $m^2/g$.

11. A liquid silicone rubber composition according to claim 1, wherein the catalyst is used in an amount of from 20 to 500 ppm of the total amount of said organopolysiloxane and said organohydrogenpolysiloxane when the catalyst is solid and in an amount of from 1 to 30 ppm, as platinum, based on the total amount when the catalyst is a platinum compound miscible with said organopolysiloxane.

12. A vulcanized elastomer product of the composition of claim 1.

13. A liquid silicone rubber composition capable of yielding a vulcanized product having good thermal conductivity, said composition comprising:

100 parts by weight of an organopolysiloxane having the following average unit formula $$R_xSiO_{(4-x)/2}$$

in which each R represents an unsubstituted or substituted monovalent hydrocarbon group, and X is a value of 1.8 to 3.0, the organopolysiloxane containing at least 0.1 mole % of an aliphatic unsaturated group in one molecule and having a viscosity of from 50 to 10,000 centistokes at 25° C.;

from 0.1 to 50 parts by weight of an organohydrogenpolysiloxane having at least two ≡SiH bonds in one molecule;

from 270 to 900 parts by weight of an alumina filler made of (a) from 10 to 95 wt % of an alumina powder having a substantially spherical shape, an average size of from 10 to 50 micrometers, and an oil absorption not larger than 30 ml/100 g, and, correspondingly, (b) from 90 to 5 wt % of an alumina powder having an average size less than 10 micrometers and an oil absorption not larger than 30 ml/100 g; and a catalystic amount of platinum or a platinum-containing compound catalyst for the addition reaction between the organopolysiloxane and the organohydrogenpolysiloxane, said composition having a viscosity not larger than 100,000 centistokes.

* * * * *